United States Patent [19]
Bayraktaroglu et al.

[11] Patent Number: 5,734,193
[45] Date of Patent: Mar. 31, 1998

[54] TERMAL SHUNT STABILIZATION OF MULTIPLE PART HETEROJUNCTION BIPOLAR TRANSISTORS

[75] Inventors: Burhan Bayraktaroglu, Huber Heights; Lee L. Liou, Dayton; Chern I. Huang, Beavercreek, all of Ohio

[73] Assignee: The United States of America as represented by the Secretary of the Air Force, Washington, D.C.

[21] Appl. No.: 521,513

[22] Filed: Aug. 30, 1995

Related U.S. Application Data

[63] Continuation of Ser. No. 185,334, Jan. 24, 1994, abandoned.
[51] Int. Cl.$^6$ .................. H01L 29/201; H01L 27/082; H01L 23/34
[52] U.S. Cl. ............... 257/579; 257/197; 257/586; 257/587; 257/593; 257/745; 257/728; 257/796
[58] Field of Search .................. 257/197, 198, 257/579, 586, 587, 593, 712, 728, 796

[56] References Cited

U.S. PATENT DOCUMENTS

| | | | |
|---|---|---|---|
| 4,389,557 | 6/1983 | Devenyi et al. | 219/85 CM |
| 4,939,562 | 7/1990 | Adlerstein | 357/34 |
| 5,026,655 | 6/1991 | Ohata | 437/40 |
| 5,066,926 | 11/1991 | Ramachandran et al. | 330/311 |
| 5,084,750 | 1/1992 | Adlerstein | 357/34 |
| 5,145,809 | 9/1992 | Walker | 437/203 |
| 5,185,274 | 2/1993 | Chang et al. | 257/198 |
| 5,196,359 | 3/1993 | Shih et al. | 437/40 |
| 5,202,752 | 4/1993 | Honjo | 257/678 |
| 5,296,733 | 3/1994 | Kusano et al. | 257/587 |

OTHER PUBLICATIONS

N.L.Wang, N.H. Sheng, M.F. Chang, W.J. Ho, G.J. Sullivan, E.A. Sovero, J.A. Higgins, and P.M. Asbeck, "Ultrahigh Power Efficiency Operation of Common–Emitter and Common–Base HBTS at 10 GHz," IEEE Trans. Microwave Theory and Tech., vol. 38, pp. 1381–1389, 1990.

P. Bartusiak, T. Henderson, T.Kim, A. Khatibzadeh, and B. Bayraktaroglu "High Efficiency Ku–Band HBT Amplifier with 1 W CW Output Power," Electronics Lett., vol. 27, pp. 2189–2190, 1991.

J.A. Higgins, "GaAs Hetrojunction Bipolar Transistors: A Second Generation Microwave Power Amplifier Transistor," Microwave J., pp. 176–194, 1991.

M.A. Khatibzadeh, B. Bayraktaroglu, and T. Kim, "12 W Monolithic X–Band HBT Power Amplifier," IEEE MTT-S Microwave and Millimeter Wave Monolithic Circuits Symp. Techn. Dig., pp. 47–50, 1992.

P. Bartusiak, T. Henderson, T. Kim, and B.Bayraktaroglu, "High-Efficiency Ku–Band HBT MMIC Power Amplifier," IEEE Electron Dev. Lett., vol. 13, pp. 584–586, 1992.

L.L. Liou, B. Bayraktaroglu, and C.I. Huang, "Thermal Stability Analysis of Multiple Emitter Finger Microwave AlGaAs/GaAs Hetrojunction Bipolar Transistors," IEEE MTT-S Microwave Symp. Tech. Dig., pp. 281–284, 1993.

(List continued on next page.)

*Primary Examiner*—Gene M. Munson
*Attorney, Agent, or Firm*—Gerald B. Hollins; Thomas L. Kundert

[57] ABSTRACT

Structure and fabrication details are disclosed for AlGaAs/GaAs microwave HBTs having improved thermal stability during high power operation. The use of a thermal shunt joining emitter contacts of a multi-emitter HBT is shown to improve this thermal stability and eliminate "current-crush" effects. A significant reduction in thermal resistance of the disclosed devices is also achieved by spreading the generated heat over a large substrate area using thermal lens techniques in the thermal shunt. These improvements achieve thermally stable operation of AlGaAs/GaAs HBTs up to their electronic limitations. A power density of 10 mW/μm2 of emitter area is achieved with 0.6 W CW output power and 60% power-added efficiency at 10 GHz. The thermal stabilization technique is applicable to other bipolar transistors including silicon, germanium, and indium phosphide devices. The disclosed fabrication sequence employs an improved two-step polyimide electrical isolation planarization sequence in preparation for fabrication of the thermal shunting element.

10 Claims, 7 Drawing Sheets

OTHER PUBLICATIONS

G.B. Gao, M.S. Unlu, H. Morkoc, and D.L. Blackburn, "Emitter Ballasting Resistor Design for, and Current Handling Capability of AlGaAs/GaAs power Hetrojunction Bipolar Transistors," IEEE Trans. Electron Dev., vol. 38, pp. 185–196, 1991.

B. Bayraktaroglu, J. Barrette, R. Fitch, L. Kehias, C.I., Huang, R. Neidhard, and R. Scherer, "Thermally–Stable AlGaAs Microwave Power HBTs," Presented at 1993 Device Research Conference, Santa Barbara, CA.

G.C. Desalvo, W.F. Tseng, and J. Comas, "Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$ and InP." J. Electrochem. Soc., vol.139, pp. 831–835, 1992.

Keh–Chung Wang, P.M. Asbeck, Mau–Chung F. Chang, D. L. Miller, G.J. Sullivan, J.J. Corcoran, and T. Hornak, "Heating Effects on the Accuracy of HBT Voltage Comparactors," IEEE Transactions on Electron Devices, vol. ED–34, No. 8, pp. 1729–1735, Aug. 87.

H. Sato, M. Minguchi, K. Sakuno, M. Akagi, M. Hasegowa, J.K. Twynan, K.M. Yamanura "Bump Heat Sink Technology—A Novel Assembly Technique Suitable for Power HBTs" Proceedings of the Gallium Arsenide Integrated Circuit Symposium, Mar. 1993K AIEEE0–7803–1393–3193.

B. Bayraktaroglu, J. Barrette, L. Kehios, C. I. Huang, R. Fitch, R. Neidlord and R. Scherer, "Very High Power Density C.W. Operation of Ga/As/AlGaAs Microwave Hetrojunction Bipolar Transistor", IEEE Electron Device Letters V14No.10 Oct. 1993.

B. Bayraktaroglu, R. Fitch, J. Barvette, R. Scherer, L. Kehias, and C. I. Huang, "Design and Fabrication of Thermally–Stable AlGaAs/Ga AS Microwave Power HBT's." Proceedings of IEEE/Cornell University Conference on Advance Concepts in High Speed Semiconductor Devices and Circuits Conference, Cornell University, N.Y., Aug. 1993.

M. Adlerstein, M. Zaitlin, G. Flynn, W. Hoke, J. Huang, G. Jackson, P. Lemonias, R. Majorone, and E. Tong, "High Power Density Pulsed X–Band Hetrojunction Bipolar Transistors," Electron. Lett., vol. 27, pp. 148–149, 91.

L.L. Liou, B. Bayraktaroglu, C.I. Huang, "Thermal Stability Analysis of Multiple Emitter Finger Microwave Al Ga As/Ga As Hetrojunction Bipolar Transistors," IEEE MTT–S—Digest, 1993.

TERMAL SHUNT STABILIZATION OF MULTIPLE PART HETEROJUNCTION BIPOLAR TRANSISTORS

This application is a continuation of application Ser. No. 08/185,334, filed Jan. 24, 1994 which is now abandoned.

RIGHTS OF THE GOVERNMENT

The invention described herein may be manufactured and used by or for the Government of the United States for all governmental purposes without the payment of any royalty.

BACKGROUND OF THE INVENTION

This invention relates to the field of solid state electronic device thermal dissipation accommodation and to the control of dissipation related internal temperatures in one or multiple physically proximate semiconductor devices or component parts in devices such as junction transistors, field effect transistors, and electrical diodes.

In the interest of text brevity and understandability, the invention herein is disclosed in terms of its embodiment in a particular species of junction transistor, the HBT (heterojunction bipolar transistor) even though it is clearly applicable to a large variety of other electronic devices.

A primary application of the aluminum gallium arsenide/ gallium arsenide (AlGaAs/GaAs) HBT is found in the field of power generation and amplification at microwave frequencies. The vertical structure of an HBT, like its silicon bipolar junction transistor (BJT) counterpart, results in highly compact transistor devices. This compactness, when coupled with the large emitter areas (2–3 μm emitter finger widths) resulting from low base sheet resistance, allows the fabrication of high density power microwave devices. Rapid progress has been made in this area over the last 5 years to make AlGaAs/GaAs HBTs competitive with the advanced GaAs FETs also used for this application. High efficiency and high power [1–2] operations have been demonstrated with discrete devices up to the Ku-band of frequencies. (Bracketed numerals herein, such as this [1–2], refer to the list of references appearing at the end of this specification.) MMIC (Microwave Monolith Integrated Circuit) applications of these materials have also been demonstrated up to X-band frequencies [3–5].

Power HBTs produced to date have, however, shown thermally limited operating characteristics. That is, thermally induced instabilities in the device establish the highest performance limitations. These thermal instabilities may be in the form of high junction temperature rise causing device burnout or in the form of non-destructive but performance limiting "current-crush" effects [6]. The actual electronic limitations in GaAs HBTs are in fact considerably higher than these thermal limits, as is demonstrated by the substantial power density improvements achieved under short pulse operation conditions [7].

Electrothermal analysis of conventional HBTs fabricated on GaAs substrates has shown that "current-crush" related instability is primarily responsible for the thermal limitations of multi-emitter finger power devices. This instability is caused by the negative temperature coefficient of the base-emitter voltage, Vbe, giving rise to uneven distribution of base current among the emitter fingers. After a certain threshold power level (determined by parasitic resistances in the device), all the base current tends to flow through a single emitter finger or emitter site on a finger, causing a drastic increase in the temperature of this finger, i.e. a hot spot.

Base and/or emitter ballast resistors are commonly used with bipolar transistors to increase the threshold of this instability to higher values [8]. It is notable in fact that the inherent presence of ballast resistors in the form of high electrical resistance metal to semiconductor contacts has been a significant factor in obscuring the achievable performance and hiding the effects of thermal limitations in many prior art investigations of the HBT and other semiconductor devices—particularly devices employing GaAs semiconductor material. The intentional ballast resistor approach, in any event, lowers the already limited microwave gain of bipolar transistors and limits their use as efficient amplifiers at higher microwave frequencies.

Both the technical publication literature and the prior patents issued by the U.S. Patent and Trademark Office include several references that are of additional background interest with respect to the present invention. Included in these references is the technical article titled "Bump Heat Sink Technology—a Novel Assembly Technique Suitable for Power HBTs" which originates with authors H. Sato, M. Miyauchi, K. Sakuno, M. Akagi, M. Hasegawa, J. K. Twynam, K. M. Yamamura, all of whom are associated with the Japanese Sharp Corporation; this article is referred to herein as the Sato et al publication. This Sato et al publication appeared at page 337 of the Proceedings of the Gallium Arsenide Integrated Circuit Symposium of March 1993 and is available from the American Institute of Electrical and Electronic Engineers under the identification number of 0-7803-1393-3/93.

The Sato et al publication describes an HBT structure in which a metallic conductor is used to remove heat from the uppermost or emitter layer of the device. The Sato et al publication also provides a number of performance characteristic curves and identifies additional references which are incorporated by reference herein. It is notable however that the Sato et al publication limits itself to a consideration of the heat removal processes in a semiconductor device. The Sato publication does not consider the performance advantages which may result from, not only heat removal, but concurrent temperature operation or thermal shunting between multiple transistor devices or between geometrically segregated portions of a single transistor or other electronic device. A principal concern of the present invention in contrast is the advantages flowing from this concurrent temperature operation or thermal shunting in both the single device and multiple device environments.

The U.S. Pat. No. 5,202,752 of K. Honjo is also of interest with respect to the present invention. The Honjo patent discloses a GaAs high-powered HBT that is embodied into a monolithic microwave integrated circuit device of the flip chip physical configuration. The Honjo patent also stops short of considering the desirability of enforced concurrent temperature operation of multiple semiconductor devices in an array.

The U.S. Pat. No. 5,066,926 issued to R. Ramachandran et al is also of interest with respect to the present invention in that it concerns heterojunction bipolar transistors that are connected into a common base cascade configuration. In addition to this common base configuration a portion of the Ramachandran et al patent transistors are also connected into a common emitter configuration. The underlying goal of the Ramachandran et al patent is to reduce thermal runaway problems in a gallium arsenide transistor, especially in view of the reduced thermal conductivity of gallium arsenide as compared with silicon and other semiconductor materials.

In view of the present invention's addressing of thermal and heat conduction aspects of an HBT circuit array and the Ramachandran et al patent being concerned with a current limiting circuit arrangement, and in the absence of disclosed physical structure in the Ramachandran et al invention, the present invention is believed readily distinguished from the disclosure of the Ramachandran et al patent.

The U.S. Pat. No. 5,145,809 of B. K. Walker is also of interest with respect to the present invention since it discloses a layer fabricated semiconductor device in which metallic path conduction is used to remove thermal energy from the device. It is notable however that the Walker invention is concerned principally with a diode structure, a Gunn diode being most specifically addressed, and is also concerned with the use of indium phosphide as a semiconductor material. The Walker patent also indicates formation of a Gunn diode on a GaAs substrate, however this substrate is preferably removed in a later processing step. The Walker patent also espouses use of the disclosed fabrication technique in fabricating other electronic devices including HBT devices. The differing materials, absence of a substrate element in the fabricated device and other differences in the Walker device are believed to provide ready distinction from the structure of the present invention.

The U.S. Pat. No. 5,084,750 of M. G. Adlerstein is also concerned with a heterojunction bipolar transistor apparatus. In the Adlerstein patent the HBT device is arranged in a push-pull circuit configuration in which successive transistors are stacked in layers. The Adlerstein invention employs air bridge elements as shown at 65 and 67 in FIG. 17 for example, for the purpose of making electrical connection with the differing layers of the structure. With respect to heat dissipation, the Adlerstein patent, commencing at column 8, line 12 describes the use of conventional steps such as via holes and plated stub structures in order to provide low thermal resistance paths between the transistors and the ground plane conductor.

The thermal energy accommodation of the present invention is however distinguished over this use of via holes, plated stub structures and the airbridge concept disclosed in the Adlerstein patent.

The patents of interest with respect to the present invention also include U.S. Pat. No. 4,389,557 issued to T. S. Devenyi et al. This patent is concerned with a laser technique for bonding a semiconductor laser chip to a heat sink and also with a two-step procedure for testing the thermal efficiency of the achieved bonding under small fixed current conditions and under a combination of DC and pulsed energization conditions. Since the Devenyi et al invention contemplates the use of Peltier effect cooling devices and is not concerned with the maintenance of similar temperatures in a multiple region semiconductor device, the present invention is believed readily distinguished from the disclosure of the Devenyi et al patent.

The patent art of interest with respect to the present invention also includes U.S. Pat. No. 5,026,655 issued to K. Ohata which concerns a gallium arsenide field effect transistor fabrication process. Since the Ohata patent is concerned with such field effect transistor devices and their fabrication rather than thermal energy control in a junction transistor, the present invention is believed readily distinguished.

The patent art of interest with respect to the present invention also includes U.S. Pat. No. 5,196,359 of H. D. Shih et al which is concerned with a method for forming a heterostructure field effect transistor using gallium arsenide semiconductor material. Since the Shih et al patent is also concerned with field effect devices and discloses little with respect to thermal energy management in a semiconductor device, the present invention is readily distinguished from the Shih et al disclosure.

SUMMARY OF THE INVENTION

The present invention is concerned with temperature controlling structural improvements providing increased power density performance in semiconductor devices such as AlGaAs/GaAs microwave power transistors. Heterojunction bipolar transistors (HBTs) and other devices are improved upon through use of the thermal energy accommodation and enforced uniform operating temperatures (across even a large area semiconductor device) in the invention. Thermally stable operation of HBTs up to their electronic limitations (10 mW/$\mu$m2 output power density at 10 GHz with 0.6 W CW output power, 7.1 dB power gain and 60% power-added efficiency or PAE) is provided. The disclosed thermal improvement structure is based on the need for an effective heat transfer path between heat sources in a multi-emitter power device. According to the invention excess heat is therefore transferred from the semiconductor device through a part of its structure using thermal shunt and thermal lens techniques. The thermal resistance of the improved semiconductor device is lowered by a factor of 2.5 to 3 compared to conventional devices.

It is an object of the present invention therefore to provide a transistor structural arrangement in which multiple components of the transistor or multiple transistors disposed in physical proximity are maintained at similar temperatures during operation.

It is another object of the invention to provide a transistor arrangement in which thermally induced electrical characteristic differences are minimized in both multiple area single transistors and physically proximate different transistors.

It is another object of the invention to provide improved heat conduction from the thermal energy dissipating regions of a power transistor device.

It is another object of the invention to provide thermal stabilization in a junction power transistor through the use of an emitter inclusive thermal energy conveyance path.

It is another object of the invention to provide for thermal and electrical common emitter connection in Junction power transistor devices.

It is another object of the invention to provide for increased thermal energy conduction efficiency into the substrate of a power transistor device.

It is another object of the invention to decrease thermal resistance in the path of thermal energy originating in the semiconductor material of a transistor device.

It is another object of the invention to provide both similar and decreased thermal resistance paths for the multiple regions of a power transistor device such as the interdigitated finger geometry of a power HBT device.

It is another object of the invention to provide improved thermal bridging techniques for a power transistor device.

It is another object of the invention to seize upon the improved thermal bonding and thermal dissipation properties that are available from the flip chip multiple layered bipolar transistor configuration.

It is another object of the invention to provide a fabrication sequence that is usable for a flip chip disposed junction transistor such as an HBT.

It is another object of the invention to provide a gallium arsenide/aluminum gallium arsenide power transistor device in which the current-crush effect commonly observed in gallium arsenide and other semiconductor materials is minimized.

It is another object of the invention to provide a microwave power transistor device of improved thermal characteristics.

It is another object of the invention to provide a junction power transistor device of the paralleled region type in which each region's contribution is optimized and optimization is without the performance-degrading effects of ballast resistors.

It is another object of the invention to provide a power transistor of the interdigitated finger multiple region type that is free of thermal effect limitations.

It is another object of the invention to provide a power transistor device capable of operating up to the electronic limitations of the semiconductor material.

It is another object of the invention to provide accommodation for the relatively low thermal conductivity of gallium arsenide and certain other semiconductor materials.

It is another object of the invention to accommodate the negative coefficient character of the emitter base turn-on voltage encountered in gallium arsenide and other transistor devices.

Additional objects and features of the invention will be understood from the following description and claims and the accompanying drawings.

These and other objects of the invention are achieved by temperature control apparatus for hot spot elimination in an array of layer disposed and common emitter electrically connected bipolar transistors comprising the combination of:

a plurality of local region heat generation elements dispersed across the array and each thermally connecting at one end thereof with an upper layer disposed transistor emitter site within the array, the heat generation elements each including a salient thermal node free end portion;

thermal shunting means of high thermal conductivity and intimate thermal connection with each of the transistor emitter site thermal node free end portions for maintaining the heat generation elements and the transistor emitter sites of the array at a thermally shunted uniform operating temperature;

the thermal shunting means extending generally parallel with the upper layer across a substantial portion of the transistor array for performing both the thermal shunting and a thermal dissipating function in the array.

DETAILED DESCRIPTION

This description is especially related to thermally stable HBTs employing "thermal shunt" and "thermal lens" techniques. The disclosed arrangements are shown to thermally stabilize AlGaAs/GaAs HBTs without degrading their microwave performance and are equally applicable to other bipolar and heterojunction transistors and other semiconductor devices. The disclosure is especially concerned with achieving a thermal shunt arrangement for AlGaAs/GaAs HBTs in order to prevent the "current-crush" effect [9]. The herein disclosed thermal shunt technique relies on thermally and electrically interconnecting the emitter fingers of a power transistor to avoid temperature differential between them. Since the temperature of all fingers and thus all of the base to emitter junctions and other transistor portions is maintained at the same level with this approach, the base current distribution to each base region of the transistor is also uniform, thereby eliminating the occurrence of current-crush and attendant hot spot formation.

Figure 1:
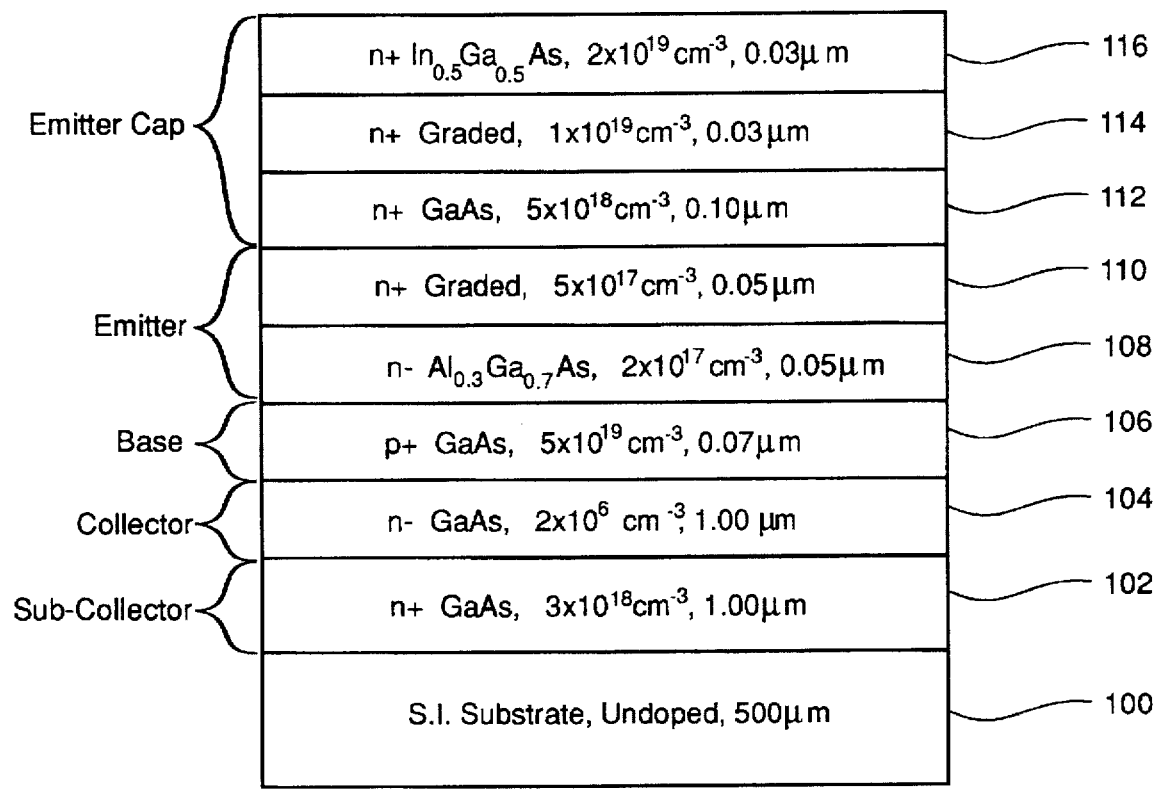
FIG. 1 shows structural details including material doping concentration and thickness dimensions for an HBT embodiment of the invention.

FIG. 1 in the drawings indicates the material, doping concentration and thickness characteristics of an HBT device fabricated according to the present invention. The epitaxial layer structures shown in FIG. 1 are preferably grown using the known Metal Organic Chemical Vapor Deposition (MOCVD) process. Silicon and carbon are used as n- and p-type dopants in the FIG. 1 HBT device. The base layer doping is maintained at $5 \times 10^{19}$ cm$^{-3}$ in this device to achieve low base sheet resistance. The common-emitter current gain value ($\beta$) achieved with this doping level is 30. A rapid drop in $\beta$ beyond the $5 \times 10^{19}$ cm$^{-3}$ doping level prevents use of higher doping levels. The collector layer is 1 μm thick; the thickness of this layer strongly influences the transistor's current gain cutoff frequency, $f_T$, and device breakdown voltage. The selected thickness is a compromise to maintain both values high.

The collector doping level is selected in FIG. 1 to maximize collector current density while maintaining full collector depletion under high bias conditions. An $In_{0.5}Ga_{0.5}As$ emitter cap layer is employed with all structures to facilitate the use of non-alloyed emitter contacts. The emitter-base junction is not intentionally graded, although a transition region of 10 nm may be present at this interface due to finite response time of the gases in a MOCVD system.

Figure 2A:
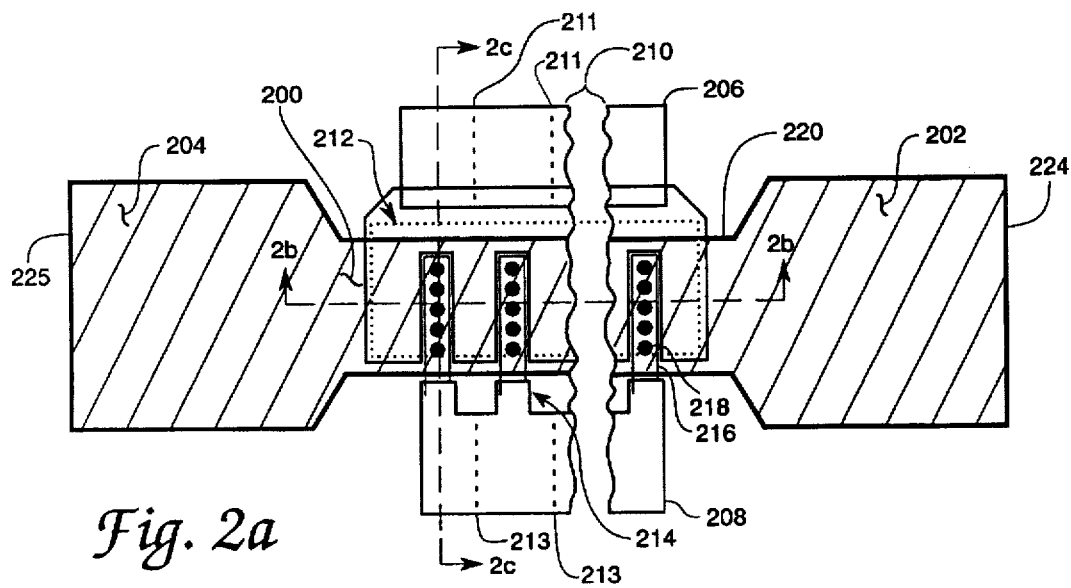
FIG. 2a shows a layout view of an HBT embodiment of the invention.
Figure 3A:
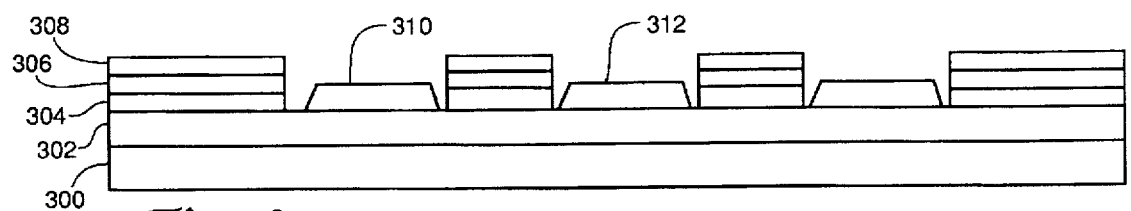
FIG. 3a shows the layers of an HBT embodiment of the invention after initial processing.
Figure 3B:
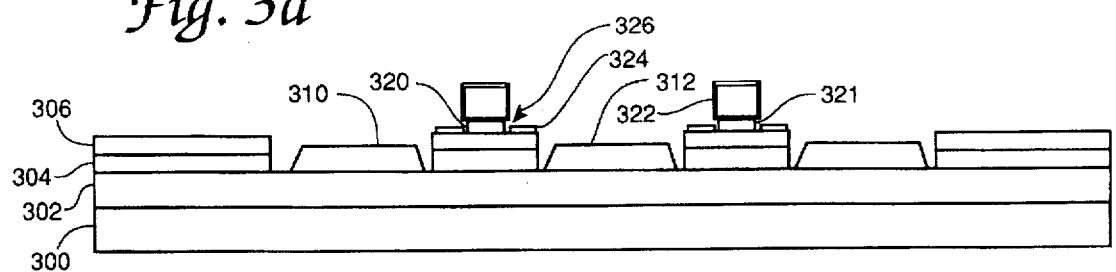
FIG. 3b shows the addition of emitter and base metal contacts and emitter layer undercut to the FIG. 3a transistor.
Figure 3C:
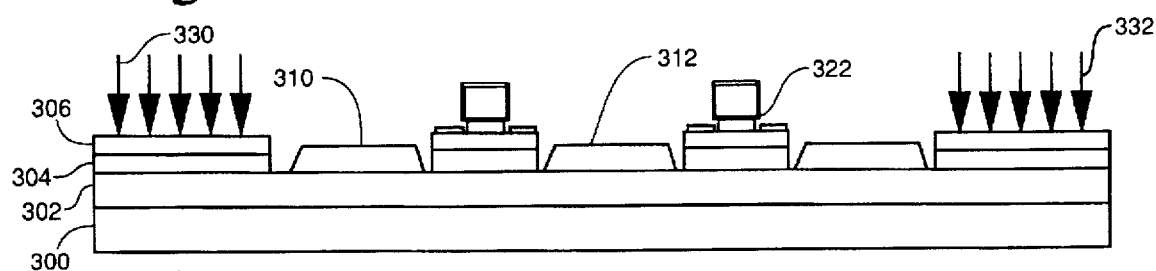
FIG. 3c shows the ion implantation of inactive areas of the FIG. 3b transistor.

Several device layout configurations are considered in arriving at the FIG. 1 HBT. Common to all configurations are the emitter-base contacts, which are self-aligned to improve microwave gain performance. The emitter of all devices considered is made of a parallel connection of multiple emitter disks arranged linearly. As shown in FIG. 2a, base contacts completely surround each emitter. The emitter disk diameter is constant within a given device, but is varied between 2 and 3 μm from device to device. The spacing between emitter disks is kept the same as the diameter. Collector contacts in the FIG. 1 HBTs are spaced 1.5 μm from the edge of the base contact and surround it on three sides. An oxygen ion implantation is used as shown in FIG. 3c to convert all areas outside of the active device to a semi-insulating state. Both base and collector contacts extend continuously from the active area to implant isolated areas to facilitate electrical contacts between device terminals and bonding pads.

Figure 2B:
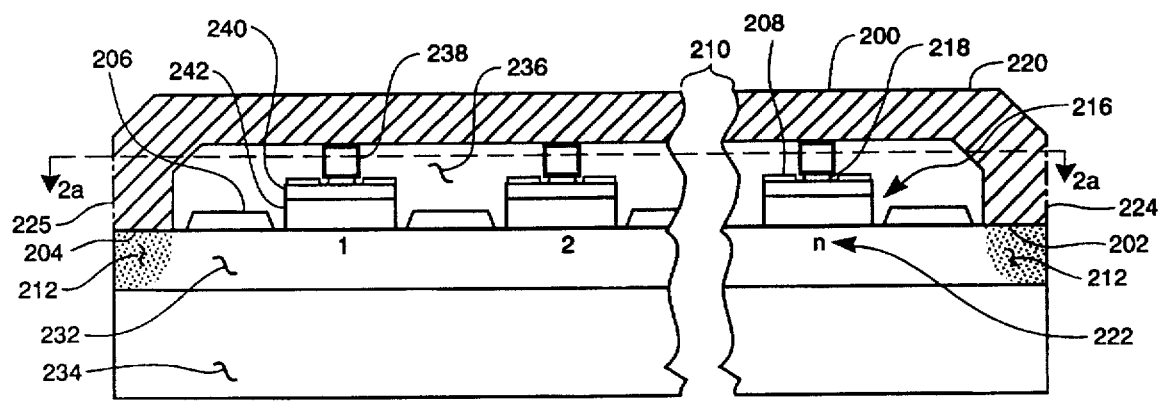
FIG. 2b shows a first cross-sectional view of the FIG. 2a transistor.
Figure 2C:
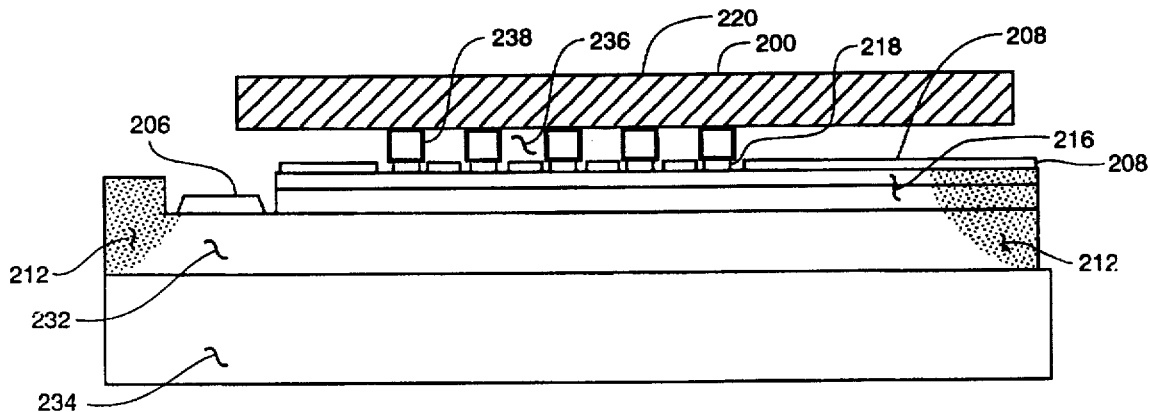
FIG. 2c shows a second cross-sectional view of the FIG. 2a transistor.

Emitter disks are connected in parallel in the FIG. 1 devices using a thick metal air bridge or thermal shunt member as is shown at 200 in FIG. 2. This bridge extends over to the isolated region and is terminated in large metal pads. As discussed below, a thick air bridge when used as a pad on GaAs acts as an effective heat spread area. The ratio of heat spread to emitter areas is preferably near 20. Cross-sectional views of a thermally stabilized HBT according to the invention are shown in FIGS. 2b and 2c of the drawings. FIGS. 2a, 2b and 2c of the drawings therefore show structural details of an HBT device fabricated according to the invention and the FIG. 1 material doping concentration and thickness dimensions, by way of an interrelated set of three views.

The FIG. 2a HBT device is provided with n interdigitated finger mesa structures, indicated typically at 216, on which are located the layered collector base and emitter sites of the HBT device. A typical emitter disk on this mesa 216 is indicated at 218 in FIG. 2a and, as described above, such disks are preferably provided with a diameter between 2 and 3 μm and spacing of these same dimensions in the presently described HBT device. Profile views of the mesa 216 and the emitter disks 218 are shown in FIGS. 2b and 2c of the drawings. These latter views are drawn to a larger scale than the FIG. 2a drawing.

Electrical contact areas for the collector and base elements of the FIG. 2a HBT are shown at 206 and 208 respectively in FIG. 2a. As indicated at 214 in FIG. 2, these contact areas extend around certain portions of the mesa structures.

These contact areas 208 and 210 may also be arranged as a plurality of electrically isolated contacts, one for each of the fingers 216 in FIG. 2, or in FIG. 2 are for each of the mesas or each finger 216 in order to configure the FIG. 2 structure as a plurality of different transistors, transistors having a common emitter connection. Such electrically isolated base and or collectors may be employed when the FIG. array comprises a part of an electrical comparator network rather than a microwave power transistor for example. Electrical isolations of the one per finger type are indicated generally by the dotted lines at 211 and 213 in FIG. 2a for example.

The FIG. 2a HBT device is shown to be provided with 3 mesa structures; the dividing region 210 and the 1 to n numbering sequence at 222 indicates the presence of additional of these interdigitated finger mesa structures in the actually embodied HBT device. The general extent of the oxygen ion implanted electrical isolation region between adjacent transistors is indicated at 212 in each of the FIG. 2a, 2b, and 2c views of the FIG. 2 device.

The thermal shunting member is shown at 200 in each of the FIG. 2a, FIG. 2b, and FIG. 2c. portions of the FIG. 2 drawing; the center-most or heat sink portion of this shunt is indicated at 220 and the heat spread or thermal lensing portions of the shunt are indicated at 224 and 225 in the FIG. 2a and FIG. 2b drawings with the heat spread area being abbreviated in FIG. 2b for drawing convenience. A significant aspect of these heat spread areas is the relatively large cross sectional area (indicated at 202 and 204) of their engagement with the sub collector layer 232 in the FIG. 2 HBT structure. This large area concept is best understood from both the FIG. 2a and 2b views of the HBT device. Effective thermal communication between these large area portions of the thermal shunt member 200 and the substrate 234 is a significant aspect of the present invention.

Additional details of the HBT embodiment of the invention appearing in FIGS. 2a, 2b and 2c include the ion implanted electrical isolation region 212, this region being indicated in dotted line form in FIG. 2a and in cross-sectional form in FIGS. 2b and 2c where shading is added to indicate the general shape of the implanted region. Also appearing in the FIG. 2b and 2c views are the base layer 240, the collector layer 242 in each of the mesas, the sub-collector layer 232 and substrate layer 234. These layers correspond to the layers 106, 104, 102, and 100 shown in FIG. 1 of the drawings. The emitter layer in FIGS. 2b and 2c is represented by the relatively small layer portion remaining in the emitter disk 218 and corresponds to the layers 108–116 in the FIG. 1 diagram.

Also represented in the FIG. 2b and 2c drawings is a polyimide electrical insulation layer 236 and the emitter contact elements 238. Additional details of these elements are disclosed below in connection with the FIG. 3 fabrication sequence and the achieved properties of the disclosed HBT device.

A device fabrication sequence for the FIG. 1 and FIG. 2 HBT device is shown in the five views of FIG. 3 and begins with collector lithography and wet chemical etching of the sub-collector layer, i.e. not shown steps preceding the FIG. 3 sequence. Standard ohmic metal Ni/Ge/Au/Ni/Au is subsequently deposited and alloyed in a rapid thermal anneal at 420° C. for 15 seconds. The resulting structure is shown in FIG. 3a, where the substrate GaAs material appears at 300, the sub-collector layer at 302, the collector layer at 304, the base layer at 306, and the emitter layer at 308. The collector contacts 310 and 312 are the only alloyed contacts in this device. To avoid any possible degradation of the exposed emitter-base junction below the emitter 320 or the emitter and base contacts during high-temperature alloying, the collector contacts are fabricated first. The wafer is not subjected to temperatures higher than 250° C. for the remainder of the processing.

The gold emitter contacts are electroplated as indicated at 322 to a height of 1 μm and centered on the base-collector mesas. InGaAs provides a desirable seed layer for electroplating. The emitter material surrounding the emitter contacts is etched using a citric acid/hydrogen peroxide based chemical etching. A citric:peroxide ratio is chosen to minimize selectively between InGaAs and GaAs and to optimally undercut the emitter metal [10] as shown at 320. TiPtAu base contacts 324, self-aligned to the emitter metal, are deposited as shown in FIG. 3b.

The active device areas are isolated using oxygen implantation, represented at 330 and 332 in FIG. 3c, of the material between devices as well as a trim etch to remove the top 1500 Å of the implanted surface. A thin layer of $Si_3N_4$ is deposited across the wafer and then etched using a $CF_4/O_2$ plasma to leave a thin $Si_3N_4$ passivation layer at 321 on the sidewalls of the emitter/base periphery. The Ti/Au pad metal i.e. at 310, 312, and 344 is then deposited on the inactive surface to provide electrically probeable contacts to the base and collector metal. The resulting device structure is shown in FIG. 3c.

Figure 3D:
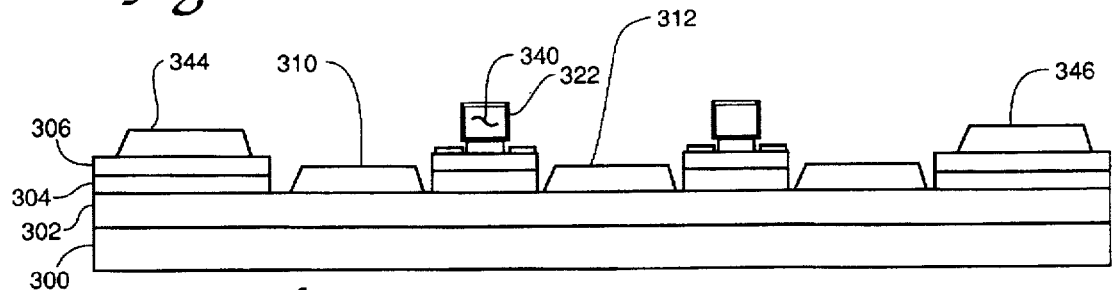
FIG. 3d shows the FIG. 3c HBT device following pad metal deposition and polyimide planarization.

The final processing steps are planarization and heat sink formation. The wafer is planarized by applying a 2.5 to 3 μm layer 342 of DuPont polyimide PI-2555 (herein PI) to the wafer. The PI is etched in a Reactive Ion Etcher (RIE) using an oxygen plasma to expose the top surface of the emitter contacts as is shown in FIG. 3d. An improved two-layer reflow sequence as is disclosed in detail in FIG. 8 and in the text below may be used for this planarization.

Figure 3E:
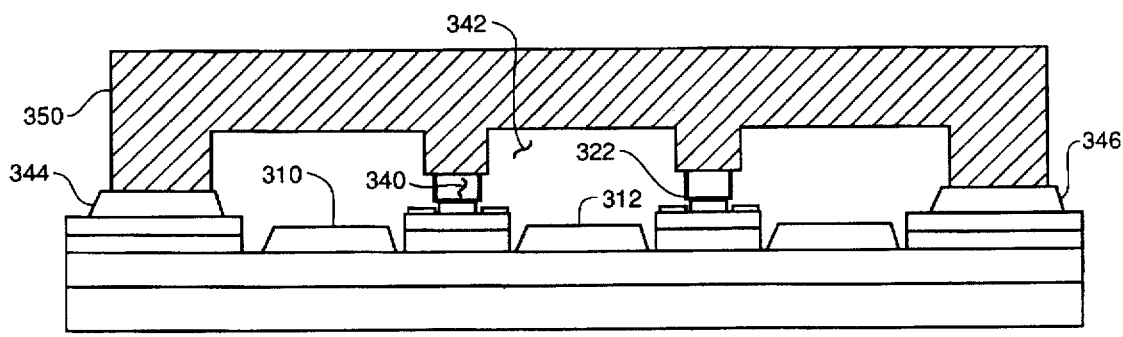
FIG. 3e shows the FIG. 3d HBT device following fabrication of the heat sink and thermal shunt member.

An evaporated Ti/Au seed layer provides continuity for electroplating posts 340 and the gold heat sink bridge 350 to the emitter contacts. The posts at 340 are 3 μm tall and terminate at a free end thereof in what is herein referred to as a thermal node. The heat sink bridge 350 is electroplated to a thickness of 22 μm. The bridge elements 350 in FIG. 3 and 220 in FIG. 2 are actually the same structure. The appearance of bridge element 350 differs, however, with respect to element 220 because FIG. 2 is a simplified drawing. The final HBT structure is shown in FIG. 3e.

Figure 4:
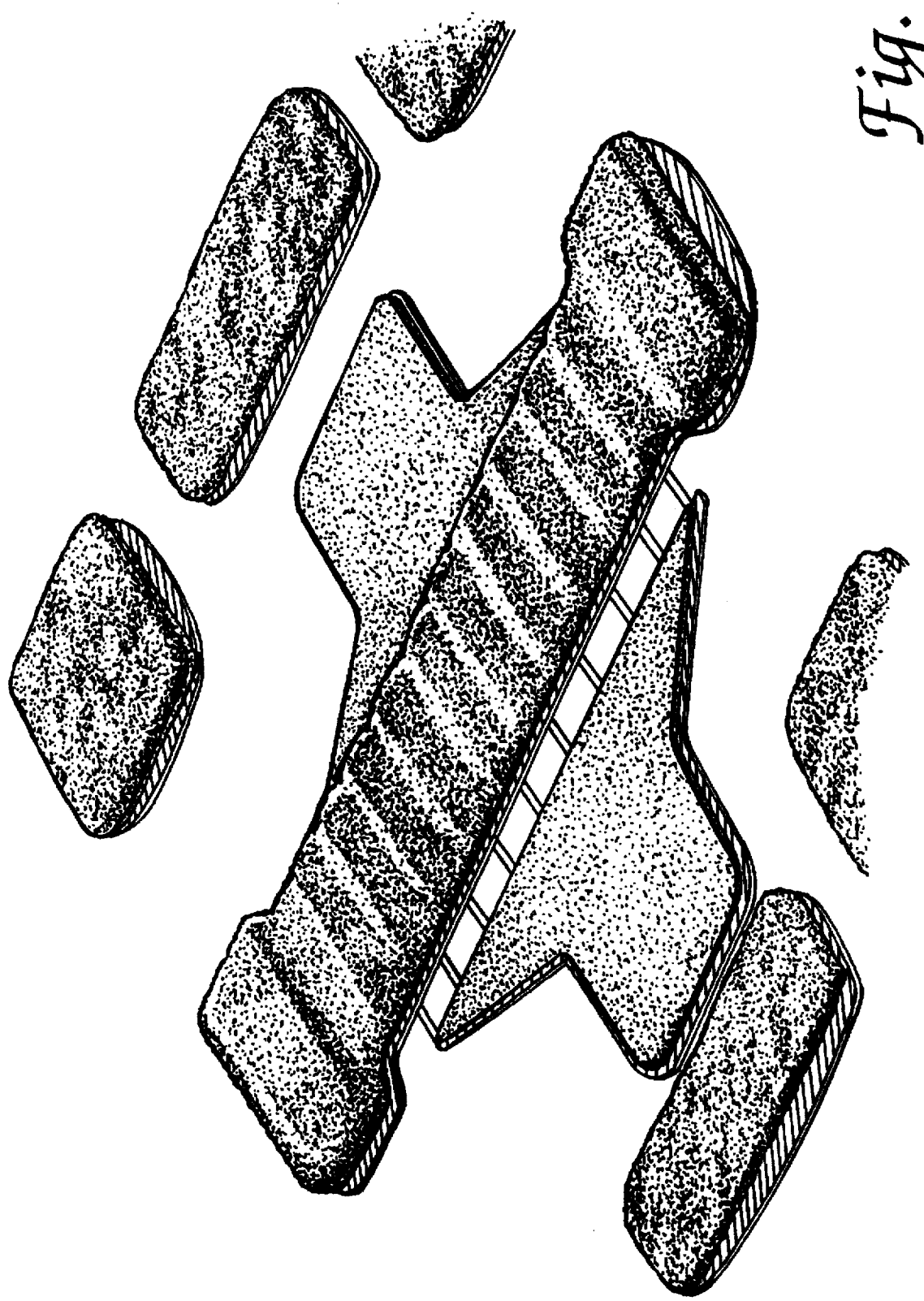
FIG. 4 shows a scanning electron microscope view of a completed HBT device according to the invention.

A drawing representation of a scanning electron microscope or SEM picture of a completed 250 μm² emitter area device according to the invention is shown in FIG. 4. In the FIG. 4 drawing, the elongated central element is the thermal shunt member and is provided with heat spread areas at its opposed ends. The adjoining foreground member is the base electrode and the similarly adjoining background member the collector electrode. In the FIG. 4 drawing a magnification near 250× prevails and the heat spread areas are of about 100 micrometer front to back dimension. The FIG. 4 drawing represents a 20 Kilovolt SEM acceleration potential.

A process for achieving the HBT device planarization referred to above herein is shown in FIG. 8 of the drawings. In this FIG. 8 sequence FIG. 8a shows an upstanding conductor member 800 such as might represent the gold emitter contact 238 in FIG. 2 with this upstanding conductor member being received on a semiconductor substrate 802.

Figure 8A:
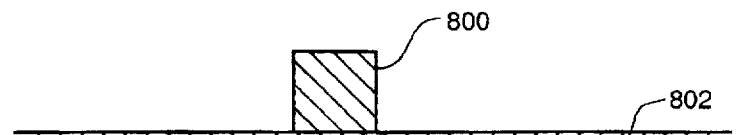
FIG. 8A shows a first step of a sequence for planarizing a partially-completed HBT device.
Figure 8B:
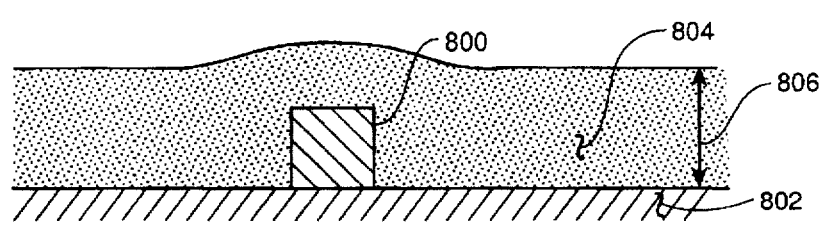
FIG. 8b shows addition of a first planarization layer to the FIG. 8a device.

A first step in the planarization or passivation and planarization of the FIG. 8a structure is shown in FIG. 8b, where a layer of insulating material 804 such the as above-described DuPont polyimide has been deposited over the upstanding conductor 800 with a thickness indicated at 806 of about 2.5 microns. A deposition of the layer 804 may be accomplished in the conventional manner of dielectric material deposition.

Figure 8C:
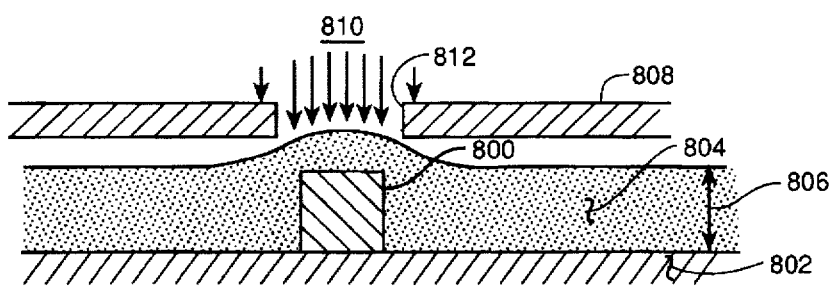
FIG. 8c shows masking of the FIG. 8b device.

The first layer of planarizing and passivating material 804 is removed from the local area region surrounding the upstanding conductor 800 as shown in the view of FIG. 8c in FIG. 8 using the mask 808 in which is received the reactive ion communicating aperture 812. The reactive ion flux 810 may be an oxygen plasma flux as is known in the art for use in removing polyimide materials. The action of this reactive ion flux 810 forms the empty recessed well 814.

Figure 8D:
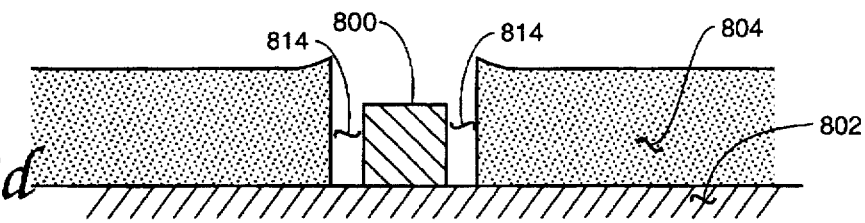
FIG. 8d shows etching results on the FIG. 8c device.

The results of the reactive ion flux etching of the polyimide layer 804 is shown in FIG. 8d where the recessed well 814, extending substantially down to the surface of the semiconductor substrate 802, is shown to surround the upstanding conductor member 800.

Figure 8E:
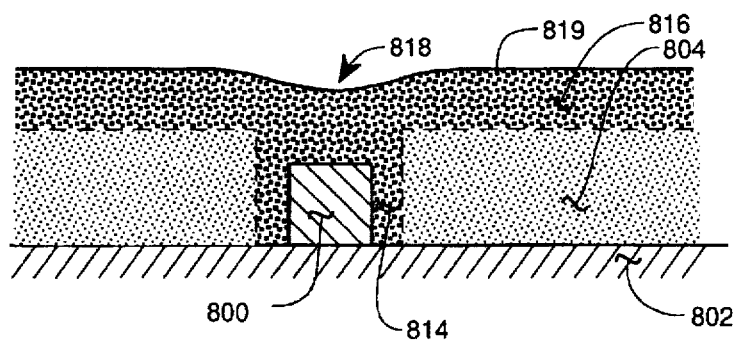
FIG. 8e shows addition of a second plannerization layer to the FIG. 8d device.

In the FIG. 8e view, a second layer of polyimide material 816 has been added to the first polyimide layer 804 and also used to fill the recessed well 814 that was formed in the steps of FIGS. 8c and 8d. This second layer 816 of polyimide material tends to be of uniform thickness except in the area of the recessed well 814, where a tendency to fill the well and leave only a minor indentation as indicated at 818 in the otherwise planar surface 819 is noted.

Figure 8F:
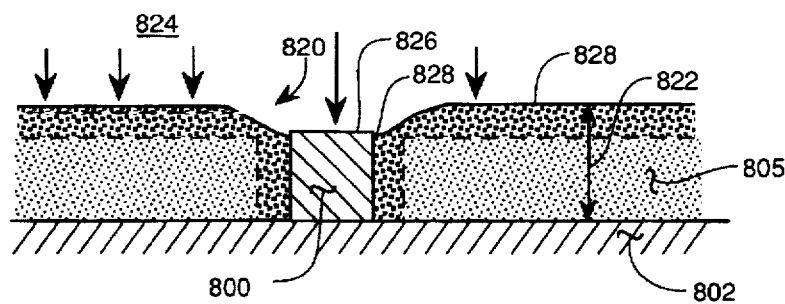
FIG. 8f shows etching results on the FIG. 8e device.

In the FIG. 8f view, the second layer of polyimide material 816 has been removed by etching uniformly over its surface until the thickness indicated at 822, which is substantially the original layer thickness 806, and a recessed area 820 corresponding to the recessed area remain. An oxygen plasma flux used for accomplishing the FIG. 8f etching is indicated at 824 and is preferably obtained also from a reactive ion etching apparatus, although it may also be a conventional oxygen plasma flux. Note that the etching step of FIG. 8f has uncovered the upper surface 826 of the upstanding conductor member 800 and preferably has extended in time until small vertically disposed portions of the subtending surface of the upstanding conductor member 800 are also exposed as is indicated at 828.

The view of FIG. 8f therefore upon omission of the oxygen plasma flux indication at 824, also represents the completed planarization and passivation covering of the surface of the semiconductor substrate 802. The exposed upper surface 826 of the upstanding conductor member 800 is suitable for reception of the heat sink portion 220 of the thermal shunt member 200, as was shown in the views of FIG. 2 and 3 above herein. The unobstructed and relatively large and now cleaned area 826 of this upstanding conductor member 800 is well suited to the large area low thermal resistance connection that is desired with the heat sink portion 220. The surrounding surface area 828 of the remaining polyimide is also found to be suitable for commencing fabrication of the heat sink portion 220.

The planarization and passivation sequence described in FIG. 8 has been found to be a desirable improvement over a conventional polyimide deposition sequence because better control of the final thickness 822 is achieved. An attending reduction of capacitance loading of the emitter base and collector elements of the formed transistor by the heat sink portion 220 is an electrical benefit realized from this controlled layer thickness. That is, it is found desirable to maintain the thickness 822 at some value above 1 micron in order to minimize capacitance loading. The herein described two layer polyimide film sequence is found to more effectively control this thickness.

The thermal limitations of an HBT can be reached due to self-heating under high bias conditions. Reaching of these thermal limitations may cause: (a) long-term reliability problems (mostly at metal contacts), (b) degraded electronic properties, and (c) thermal runaway. The first two limitations require a temperature rise of at least 300° C. to be significant in GaAs devices, whereas the third limitation can occur at much lower temperatures.

Device layout and size are important factors in determining which of these thermal limitations is the dominant mechanism in a particular environment. The bias of a single-emitter, small-area device can, for example, be increased until a critical junction temperature is reached—a temperature beyond which device reliability is unacceptable. The thermal limitations of multi-emitter microwave power devices, however, are usually determined by an onset of the thermal runaway condition [6]. This can be understood from the drawing views of FIGS. 5a, 5b, 5c, 5d, 5e and 5f in FIG. 5, where physical, electrical, and thermal models of a conventional multi-emitter HBT and an HBT device according to the present invention are respectively shown.

Figure 5A:
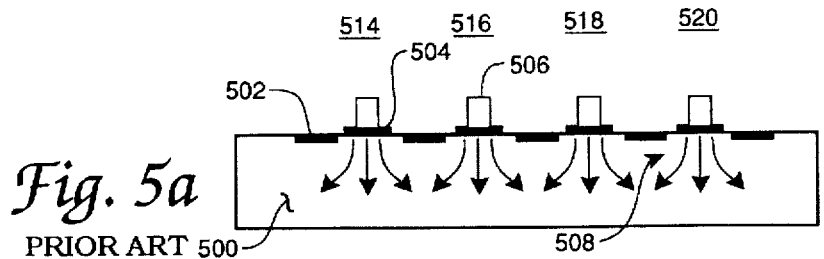
FIG. 5a shows the heat flow arrangement in a conventional HBT device.
Figure 5B:
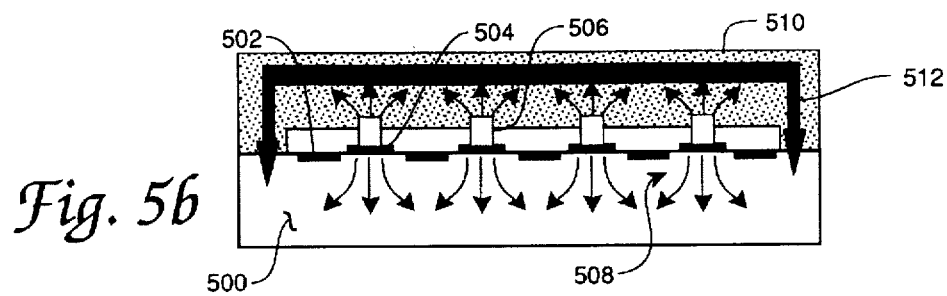
FIG. 5b shows the heat flow arrangements in an HBT device fabricated in accordance with the invention.
Figure 5C:
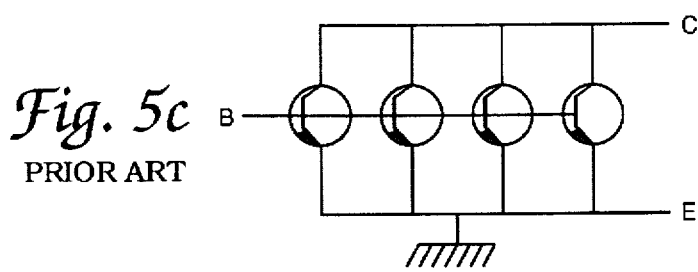
FIG. 5c shows an electrical schematic for a conventional HBT device.
Figure 5D:
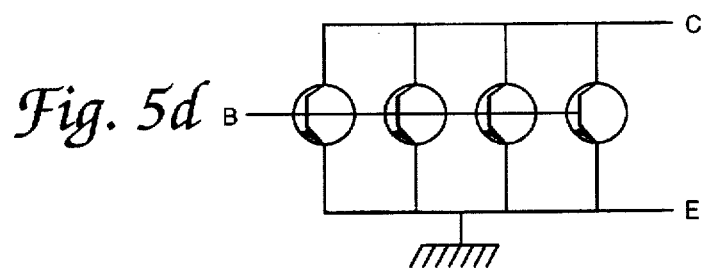
FIG. 5d shows an electrical schematic for an HBT device according to the present invention.

In the electrical models of FIGS. 5c and 5d in FIG. 5 each illustrated transistor symbol corresponds to a single finger received emitter, base and collector of a multi-finger device. Each set of terminals of the FIG. 5c and FIG. 5d HBT (i.e. the respective emitters, bases and collectors) are electrically interconnected. Because of the negative temperature dependence of Vbe(on) however, the electrical and thermal characteristics of these parallel connected devices are not always identical in a practical operating situation.

Figure 5E:
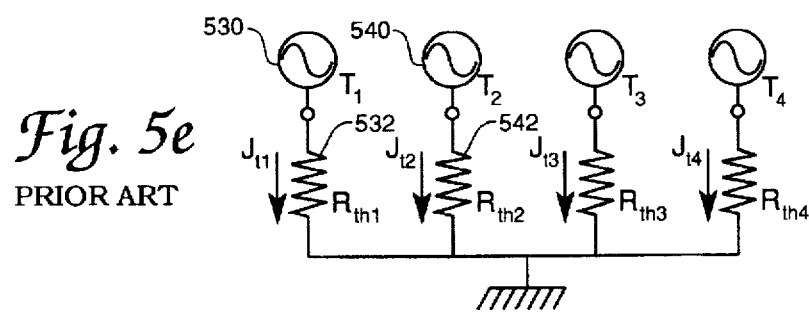
FIG. 5e shows a thermal model for a conventional HBT device.

The thermal model of a conventional HBT device in the FIG. 5e view of FIG. 5 shows that heat from each part of the device is in fact dissipated through the thermal resistors Rth1 . . . Rth4 at 532, 542 etc. Since very little cross-coupling exists between the heat sources at 530 and 540 for example, the temperature of each element in such a conventional HBT device is independently determined by the local bias conditions. Because all terminals of the device are electrically connected in parallel, the base current distribution to each element is a function of the local temperature.

The previously referred-to practice of employing emitter circuit ballast resistors of course attempts to accommodate this base current temperature sensitivity characteristic, but as indicated, introduces device performance limitations of its own. However, the unaccommodated negative temperature coefficient of the base-emitter turn-on voltage, $V_{be}$(on), can cause a local increase in base current (and therefore collector current) in the hotter parts of the FIG. 5e device. The increased current in these regions can, in turn, increase the local temperature even further.

This bootstrap or positive feedback mechanism can result in thermal runaway in bipolar transistors. Because of the negative temperature dependence of current gain, however, such thermal runaway in GaAs HBTs does not always result in device burnout. Instead, the "current-crush" effect is observed wherein the collector current suddenly drops [6]. A device operating in such a "current-crush" mode develops local hot spots within the device and this adversely affects the device's reliability. Further, the DC and microwave performance of such a device is severely degraded [6] primarily because major portions of the device remain less active as a result of their lower temperature.

Figure 5F:
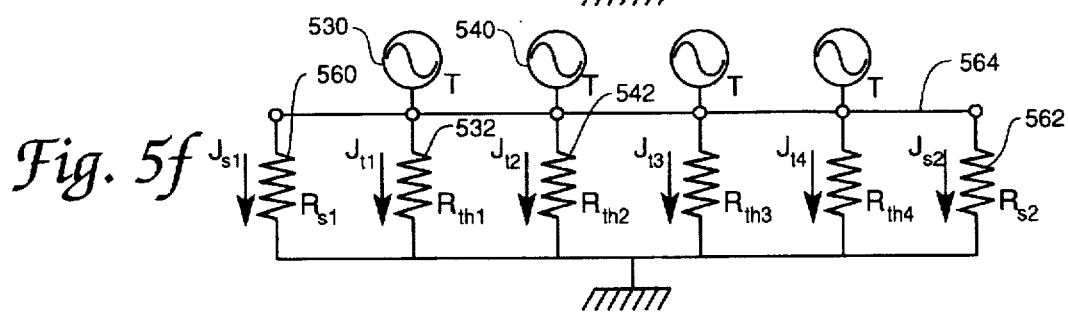
FIG. 5f shows a thermal model for an HBT according to the invention.

As an alternative to these effects and the also undesirable ballast resistors, the thermal shunting of the present invention can be used between such portions as the emitters of a power transistor, as is shown in the thermal schematic diagram of FIG. 5f. As is disclosed in connection with FIG. 4 above, such a thermal shunt can be fabricated between emitters in FIG. 5 using thick metal air bridges, so that the thermal resistance of the shunt is very small compared with other relevant thermal resistances—including the heat sink resistance.

The electrical model of a thermal shunt stabilized transistor is identical to that of conventional devices as is shown in FIG. 5d. Thermal characteristics are, however, significantly different, as is shown in FIG. 5f. Because of the presence of the thermal shunt between emitter elements, as is represented at 564 in FIG. 5f, the shunted device temperatures are the same at all points. This in turn enables a uniform base current distribution in the device and normal transistor performance in the presence of local heating.

The FIG. 5f thermal stabilization of a power device therefore effectively removes the "current-crush" related thermal limitation. The CW performance of such a shunted device is thus caused to be similar to that found in single emitter and small area devices operating under the same bias conditions. In addition, whereas the low thermal conductivity of GaAs usually severely limits the heat removal rate from an active device area and is the most significant thermal limitation of device performance, the overall thermal resistance of the device now becomes the effective thermal limitation. The multiple heat flow paths for the presently described HBT device are shown in FIG. 5b of the drawings.

To lower the thermal resistance of the present invention devices, heat spreaders are also employed at the ends of thermal shunt bridges (see 224 and 225 in FIGS. 2a and 2b). In this device arrangement the majority of the device developed heat is removed through the emitter metal contact 238, the thermal heat sink shunt bridge 220, and the corresponding elements in FIG. 5f, the thermal resistors Rs1 and Rs2 at 560 and 562. Because the heat sink area is considerably larger than the emitter area, and the heat path from the device to the heat sinks is all metal, this arrangement produces an apparent increase in the heat sink area of the device. Such a magnification of the heat sinking area may be referred to as a "thermal lens" effect.

Figure 6:
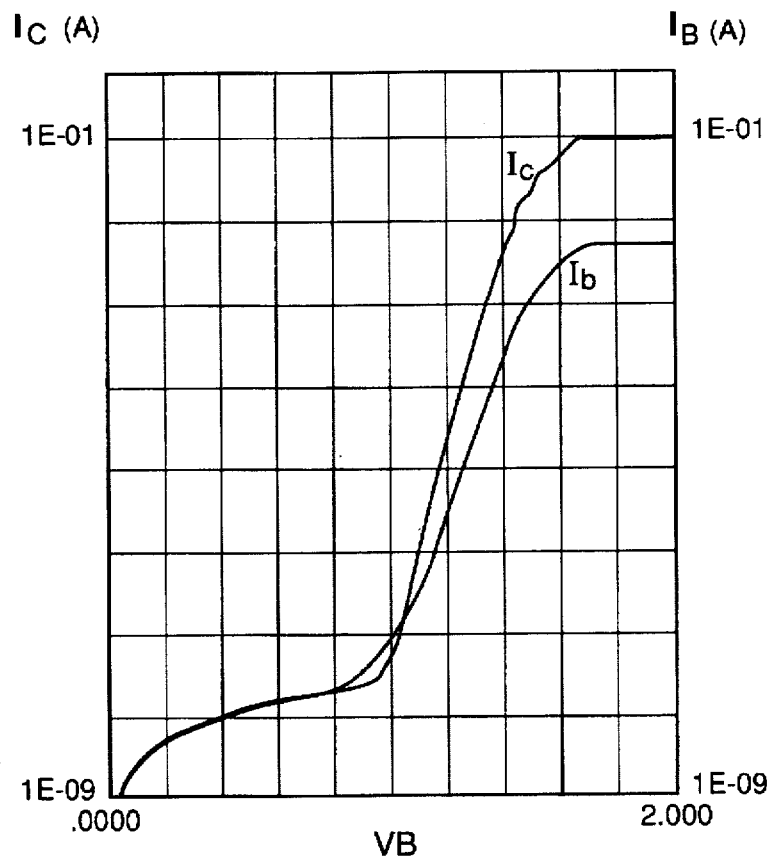
FIG. 6 shows a Gummel plot of base voltage versus base current and collector current for an HBT device according to the invention.
Figure 7:
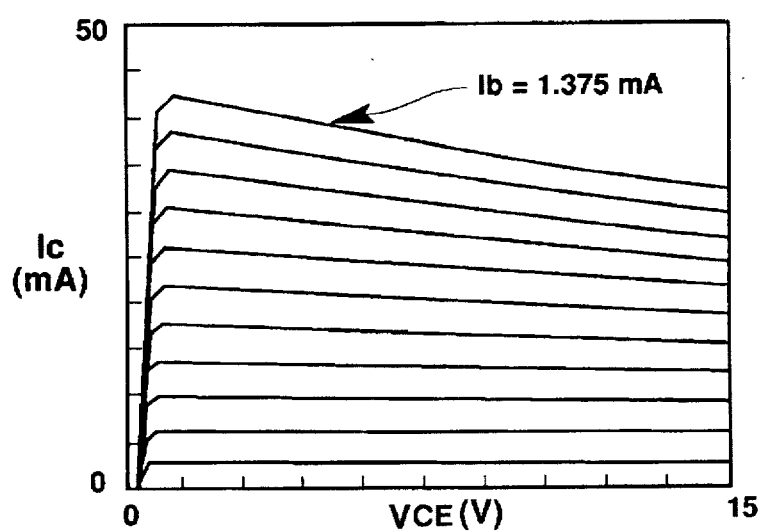
FIG. 7 shows a plot of collector voltage versus collector current for an HBT device according to the invention.

Typical Gummel plots of $V_B$ vs. $I_c$ and $I_B$ and a plot of common-emitter I–V characteristics for a 150 $\mu m^2$ emitter area HBT device according to the invention, a device with 3 $\mu m$ diameter emitter disks, are shown in FIGS. 6 and 7 respectively herein. As shown in the DC characteristics, the current gain obtained with small emitter area devices (microwave devices) is now almost the same as that obtained with large-area devices (DC devices). This insensitivity of current gain to emitter periphery/area ratio is indicative of reduced recombination current density at the perimeter of the emitter mesa and close to the surface of the base layer. The temperature coefficient of emitter-base (Vbe) turn-on voltage is measured to be between $-1.95$ and $-2.05$ mV/C°, nearly independent of device size and base current. Temperature dependent variation of Vbe may in fact be used to estimate the thermal resistance of a device [11].

A total thermal resistance value for a present invention 60 $\mu m^2$ emitter area device with 3 $\mu m$ emitter disks mounted in test fixtures with silver epoxy has been measured as 350° C./W. The thermal resistance of the same device without the thermal bridge is estimated to be 2.5 to 3.0 times higher than this value. The emitter series resistancer $R_{EE}$ of various size devices has also been measured using the "open-collector" method and a curve tracer. It is found that the emitter series resistance (contact resistance plus bulk emitter resistance) is $2.6 \times 10^{-6}$ ohm-cm$^2$ of emitter area and is scaled well with emitter area. This value of emitter series resistance is too small to function as a ballast resistor for HBTs [8].

Small-signal measurements of the described devices may be made using apparatus such as an HP8510C automatic network analyzer, such instruments are manufactured by Hewlett Packard Corporation of Palo Alto Calif. On-wafer tests of the herein described devices in the frequency range from 500 MHz to 62.5 GHz shows the current gain cutoff frequency, fT, to be 35 GHz. The maximum frequency of oscillation, $f_{max}$ is 50 GHz. These measurements are determined from the computed $|h_{21}|^2$ and unilateral power gain curves. The devices are biased at $V_{CE}$=3 V and $I_c$=2×10$^4$ A/cm2, for these small-signal microwave measurements.

Large-signal measurements at 3, 7.5 and 10 GHz may also be performed on carrier-mounted devices of various sizes. Off-chip coaxial mechanical tuners can be used to match the input and output impedances of the devices for these measurements. The results shown in Table 1 are obtained with devices operating in the common-emitter mode with $V_{CE}$= 13 V. It is seen that the power density is the highest for smaller area devices as a result of more effective heat sinking. The output power density of the Table 1 devices is in the range of 9–10 mW/µm2 of emitter area for CW output powers up to 600 mW at 10 GHz. Similar power densities are obtained at 3 and 7.5 GHz, but with higher power gain. A maximum power density of 10 mW/µm2 is obtained at 10 GHz with 0.6 W CW output power and 60% power-added efficiency (PAE).

The same device, when tuned for best efficiency, produces 67.2% PAE (81.4% collector efficiency) with 0.56 W CW output power and 7.6 dB gain. The power density under this condition is 9.3 mW/µm2. The collector current density and the estimated junction temperature at this operating condition were 9.5×10$^4$ A/cm$^2$ and 49° C., respectively. The current density is limited by the onset of the Kirk effect. The junction temperature rise is low because of effective heat spreading and high collector efficiency.

The highest output power achieved in the measured devices is 2.5 W at 7.5 GHz with a 600 µm$^2$ device. The power density of this device is thermally limited to 4.2 mW/µm$^2$ because of lower collector efficiency, which is mostly a result of the limited tuning range of the microwave test system used. However, the power density is still considerably higher than previous HBTs with similar output levels.

Although the invention herein is disclosed using references to an HBT device and to the microwave circuit utilization of this HBT device, it will be appreciated by those skilled in the electrical art that the concepts of the invention may also be applied to HBT device used in other electrical circuits—such as the signal comparators described in reference [12] below herein. The invention may also be used in other non-HBT devices.

In conclusion, it is interesting to note that the present invention provides resolution of a thermal problem which has provided difficulty, especially in the Gallium arsenide transistor art, for a long period of time. Even though thermal runaway and thermally induced collector current instabilities have been recognized for quite some time in silicon and other semiconductor materials, the different "current-crush" effect observed in GaAs, (rather than the exponential current increase observed in silicon devices), the difficulty in fabricating ballast-resistor effect free low electrical resistance contacts at GaAs device base and emitter terminals, and the previously perceived difficulties in communicating junction thermal energy from a transistor device through its emitter structure are believed to have combined to heretofore preclude recognition and use of the performance enhancing benefits flowing from the present invention.

While the apparatus and method herein described constitute a preferred embodiment of the invention, it is to be understood that the invention is not limited to this precise form of apparatus or method and that changes may be made therein without departing from the scope of the invention which is defined in the appended claims.

TABLE 1

Microwave Performance of Discrete HBTs

| Emitter Feature Size (µm) | Total Emitter Area (µm$^2$) | Frequency (GHz) | Gain (dB) | Power Output (W) | Power Density (mW/µm2) | PAE (%) |
|---|---|---|---|---|---|---|
| 2 | 30 | 3.0 | 12.2 | 0.27 | 9.0 | 60.6 |
| 2 | 75 | 7.5 | 7.6 | 0.63 | 8.4 | 48.8 |
| 2 | 250 | 7.5 | 4.3 | 1.76 | 7.0 | 36.0 |
| 2 | 250 | 7.5 | 7.4 | 1.50 | 6.0 | 52.0 |
| 2 | 600 | 7.5 | 3.4 | 2.52 | 4.2 | 31.8 |
| 2 | 600 | 7.5 | 5.4 | 2.50 | 4.2 | 40.1 |
| 2 | 60 | 10.0 | 7.6 | 0.56 | 9.3 | 67.2 |
| 2 | 60 | 10.0 | 7.1 | 0.60 | 10.0 | 60.0 |

REFERENCES

ALL ITEMS LISTED ARE INCORPORATED HEREIN BY REFERENCE. ITEMS BELOW ARE REFERRED TO IN THE PRECEDING SPECIFICATION.

[1] N. L. Wang, N. H. Sheng, M. F. Chang, W. J. Ho, G. J. Sullivan, E. A. Sovero, J. A. Higgins, and P. M. Asbeck, "Ultrahigh Power Efficiency of Common-Emitter and Common-Base HBTs at 10 GHz," IEEE Trans. Microwave Theory and Tech., vol. 38, pp. 1381–1389, 1990.

[2] P. Bartusiak, T. Henderson, T. Kim, A. Khatibzadeh, and B. Bayraktaroglu, "High-efficiency Ku-band HBT Amplifier with 1 W CW Output Power," Electronics Lett., vol. 27, pp. 2189–2190, 1991.

[3] J. A. Higgins, "GaAs Heterojunction Bipolar Transistors: A Second Generation Microwave Power Amplifier Transistor," Microwave J., pp. 176–194, 1991.

[4] M. A. Khatibzadeh, B. Bayraktaroglu, and T. Kim, "12 W Monolithic X-Band HBT Power Amplifier," IEEE MTT-S Microwave and Millimeter Wave Monolithic Circuits Symp. Techn. Dig., pp. 47–50, 1992.

[5] P. Bartusiak, T. Henderson, T. Kim, and B. Bayraktaroglu, "High-efficiency Ku-band HBT MMIC Power Amplifier," IEEE Electron Dev. Lett., vol. 13, pp 584–586, 1992.

[6] L. L. Liou, B. Bayraktaroglu, and C. I. Huang, "Thermal Stability Analysis of Multiple Finger Microwave AlGaAs/GaAs Heterojunction Bipolar Transistors," IEEE MTT-S Microwave Symp. Tech. Dig., pp. 281–284, 1993.

[7] M. Adlerstein, M. Zaitlin, G. Flynn, W. Hoke, J. Huang, G. Jackson, P. Lemonias, R. Majorone, and E. Tong, "High Power Density Pulsed X-Band Heterojunction Bipolar Transistors," Electron. Lett., vol. 27, pp. 148–149, 1991.

[8] G. B. Gao, M. S. Unlu, H. Morkoc, and D. L. Blackburn, "Emitter Ballasting Resistor Design for, and Current Handling Capability of AlGaAs/GaAs Power Heterojunction Bipolar Transistors," IEEE Trans. Electron Der, vol 38, pp. 185–196, 1991.

[9] B. Bayraktaroglu, J. Barrette, R. Fitch, L. Kehias, C. I. Huang, R. Neidhard, and R. Scherer, "Thermally-Stable AlGaAs Microwave Power HBTs," presented at 1993 Device Research Conference, Santa Barbara, Calif.

[10] G. C. DeSalvo, W. F. Tseng, and J. Comas, "Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.47}As$ and InP," J. Electrochem. Soc., vol. 139, pp. 831–835, 1992.

[11] D. S. Whitefield, C. J. Wei, and J. C. M. Hwang, "Temperature Dependent Large-Signal Model of Heterojunction Bipolar Transistors," IEEE GaAs IC Symp. Tech. Dig., pp. 221–224, 1992.

[12] Keh-Chung Wang, P. M. Asbeck, Mau-Chung F. Chang, D. L. Miller, G. J. Sullivan, J. J. Corcoran, and T. Hornak, "Heating Effects on the Accuracy of HBT Voltage Comparators," IEEE Transactions on Electron Devices, Vol. ED-34, No. 8, pp. 1729–1735, August 1987.

[13] H. Sato, M. Minguchi, K. Sakuno, M. Akagi, M. Hasegowa, J. K. Twynan, and K. M. Yamanura, "Bump Heat Sink Technology—a Novel Assembly Technique Suitable for Power HBTs" Proceedings of the Gallium Arsenide Integrated Circuit Symposium, March 1993, AIEEEO-7803-1393-3193.

[14] B. Bayraktaroglu, J. Barrette, L. Kehios, C. I. Huang, R. Fitch, R. Neidlord and R. Scherer, "Very High Power Density C. W. Operation of Ga/As/AlGAs Microwave Heterojunction Bipolar Transistors", IEEE Electron Device Letters, vol 14, No. 10, October 1993.

[15] L. L. Liou, B. Bayraktaroglu, C. I. Huang, "Thermal Stability Analysis of Multiple Emitter Finger Microwave Al Ga As/Ga As Hetrojunction Bipolar Transistors," IEEE MTT-S-Digest, 1993.

[16] B. Bayraktaroglu, R. Fitch, J. Barvette, R. Scherer, L. Kehias, and C.I. Huang, "Design and Fabrication of Thermally Stable AlGaAs/GaAs Microwave Power HBT's," Proceedings of IEEE/Cornell University Conference on Advance Concepts in High-Speed Semiconductor Devices and Circuits Conference, Cornell University, NY, August 1993.

We claim:

1. Bipolar transistor apparatus comprising the combination of:

a semiconductor substrate member;

first semiconductor layer means including both a lowermost sub collector layer and an overlaying collector layer disposed proximate an exposed surface of said substrate member and including a collector layer first doped region of first shape configuration for achieving transistor collector element realization;

second semiconductor layer means overlaying said first semiconductor layer means and including a second doped region of second shape configuration and alignment with said first semiconductor layer means first shape configuration region for transistor base element realization;

third semiconductor layer means overlaying said second semiconductor layer means and including a third doped region of selected shape configuration and alignment with said second semiconductor layer means shape configuration for transistor emitter element realization;

said first, second and third semiconductor layer means comprising a first transistor site in said transistor apparatus;

fourth layer means of a rigid electrical insulating material overlaying said third semiconductor layer means for electrically and physically isolating third semiconductor layer means surface area-received portions of said transistor site;

thermal conductor means extending through said fourth layer means and thermally connecting with said third semiconductor layer means transistor emitter element for conveying thermal energy from said transistor emitter element and semiconductor regions adjacent said emitter element to a fourth layer means surface region-received thermal node portion of said thermal conductor means;

thermal shunting means received over said fourth layer means on an exterior surface of said transistor apparatus and connecting with said thermal conductor means thermal node portions and with an additional thermal node portion of a second transistor site in said transistor apparatus for maintaining said transistor element sites at similar operating temperatures;

heat spreader means received on said first layer means sub collector layer in substantial cross sectioned area thermal communication with said sub collector layer and said substrate member underlying said sub collector layer and thermally connected with an extremity of said thermal shunting means for conducting thermal energy received via said thermal conductor means and said thermal shunting means from said third semiconductor layer means transistor emitter element into said substrate member for dissipation.

2. The transistor apparatus of claim 1 wherein said transistor apparatus comprises a plurality of physically displaced individual junctions of a heterojunction array, said heterojunction array junctions including common electrical connections via a metallic embodiment of said thermal shunting means.

3. The transistor apparatus of claim 1 wherein said transistor apparatus comprises a single heterojunction bipolar transistor of an interdigitated finger, and multiple emitter sites on each interdigitated finger, configuration.

4. The transistor apparatus of claim 1 wherein said semiconductor layer means is comprised of gallium arsenide semiconductor material.

5. The transistor apparatus of claim 1 wherein said first and second semiconductor layer means include predetermined shape configurations and also include collector and base electrical contact areas.

6. The transistor apparatus of claim 5 wherein said first semiconductor layer means sub collector layer is comprised of doped gallium arsenide semiconductor material and said collector electrical contact area is received on said sub collector layer.

7. The transistor apparatus of claim 1 wherein said thermal shunting means includes a plated metallic conductor member extending to opposite lateral sides of said transistor apparatus.

8. The transistor apparatus of claim 7 wherein said thermal shunting means plated metallic conductor includes heat transmission means, of substantial transistor site included surface area thermal communication with said semiconductor substrate member, for conducting heat communicated by said thermal shunting means to said semiconductor substrate member.

9. The transistor apparatus of claim 1 wherein said fourth layer means comprises a layer of Polyimide material.

10. The transistor apparatus of claim 1 further including an ion implanted electrical isolation region located at lateral extremities of said first second and third semiconductor layer means.

* * * * *